(12) United States Patent
Mishima et al.

(10) Patent No.: US 7,923,098 B2
(45) Date of Patent: Apr. 12, 2011

(54) LOW-DEFECT-DENSITY CRYSTALLINE STRUCTURE AND METHOD FOR MAKING SAME

(75) Inventors: Tetsuya Mishima, Norman, OK (US); Madhavie Edirisooriya, Norman, OK (US); Michael B. Santos, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 14 days.

(21) Appl. No.: 11/968,544

(22) Filed: Jan. 2, 2008

(65) Prior Publication Data

US 2009/0169843 A1 Jul. 2, 2009

(51) Int. Cl.
*B32B 7/02* (2006.01)
*C30B 19/00* (2006.01)

(52) U.S. Cl. ... 428/212; 117/54; 438/478; 257/E21.461; 428/213

(58) Field of Classification Search .................... None
See application file for complete search history.

(56) References Cited

U.S. PATENT DOCUMENTS

| | | | |
|---|---|---|---|
| 5,168,330 A | 12/1992 | Vitkavage et al. | |
| 5,183,776 A | 2/1993 | Lee | |
| 5,221,367 A | 6/1993 | Chisholm et al. | |
| 5,356,509 A | 10/1994 | Terranova et al. | |
| 5,810,924 A | 9/1998 | Legoues et al. | |
| 6,291,842 B1 | 9/2001 | Nakayama | |
| 6,503,773 B2 | 1/2003 | Fitzgerald | |
| 6,841,001 B2 | 1/2005 | Saxler | |
| 6,943,386 B2 | 9/2005 | Tsai | |
| 6,967,360 B2 | 11/2005 | Anda et al. | |
| 6,987,310 B2 | 1/2006 | Lee et al. | |
| 7,045,836 B2 | 5/2006 | Lee et al. | |
| 2004/0075464 A1* | 4/2004 | Samuelson et al. | 326/37 |
| 2004/0259334 A1* | 12/2004 | Bedell et al. | 438/478 |
| 2005/0158971 A1 | 7/2005 | Lin et al. | |
| 2006/0057403 A1* | 3/2006 | Bedell et al. | 428/450 |
| 2007/0105350 A1* | 5/2007 | Bedell et al. | 438/478 |

OTHER PUBLICATIONS

Debdeep, et al., "Dislocation scattering in a two-dimensional electron gas", Applied Physics Letters, vol. 76, No. 13, pp. 1707-1709, 2000.
Matthews, et al., "Defects in Epitaxial Multilayers", Journal of Crystal Growth 27, North Holland Publishing Co., pp. 118-125, 1974.

* cited by examiner

*Primary Examiner* — Jennifer C McNeil
*Assistant Examiner* — Vera Katz
(74) *Attorney, Agent, or Firm* — Dunlap Codding, P.C.

(57) ABSTRACT

A low-defect-density crystalline structure comprising a first crystalline material, a layer of second crystalline material epitaxially grown on the first crystalline material, and a layer of third crystalline material epitaxially grown on the second layer such that the second layer is positioned between the first crystalline material and the third crystalline material. The second and third crystalline materials cooperate to form a desirable relationship. The crystalline structures of the second crystalline material and third crystalline material have a higher crystalline compatibility than the first crystalline material and third crystalline material. The layer of second crystalline material is sufficiently thick to form the desirable relationship with the third crystalline material but sufficiently thin for the layer of second crystalline material to be strained. The layer of third crystalline material is grown to a thickness beyond a thickness had the third layer been grown on an unstrained second layer.

11 Claims, 5 Drawing Sheets

PRIOR ART

LOW-DEFECT-DENSITY CRYSTALLINE STRUCTURE AND METHOD FOR MAKING SAME

STATEMENT REGARDING FEDERALLY SPONSORED RESEARCH OR DEVELOPMENT

This invention was made with government support under Contracts DMR0520550; DMR0080054; and DMR0510056 awarded by the National Science Foundation. The government has certain rights in the invention.

CROSS-REFERENCE TO RELATED APPLICATIONS

Not applicable.

THE NAMES OF THE PARTIES TO A JOINT RESEARCH AGREEMENT

Not applicable.

REFERENCE TO A "SEQUENCE LISTING," A TABLE, OR A COMPUTER PROGRAM LISTING APPENDIX SUBMITTED ON A COMPACT DISC AND AN INCORPORATION BY REFERENCE OF THE MATERIAL ON THE COMPACT DISC

Not applicable.

BACKGROUND OF THE INVENTION

In a crystal, the atoms are arranged in a periodical pattern. A box-shaped repetition unit can be formed by an imaginary connecting of several atoms. Such a box is called a unit cell. A lattice constant is a measure of the size of a unit cell, which has a dimension of length. The energies of electrons in a crystal can spread in certain ranges called energy bands. The region between adjacent energy bands is called an energy gap or a band gap. Some energy bands remain either unfilled or partially filled with electrons. Among such energy bands, the lowest one in energy is called the conduction band. Among the energy bands filled with electrons, the highest one in energy is called the valence band. Only bands that are partially, but not fully filled, contribute to electrical conduction.

Based on the structure of energy bands, crystals are usually classified in three categories: insulators, metals, and semiconductors. Metals have a conduction band that is partly empty and partly filled regardless of temperature. Insulators and semiconductors have a large (usually >4 eV) and small (<4 eV) band gap, respectively, between their conduction and valence bands.

In semiconductors at a finite temperature, electrons can be excited from the valence bands to the conduction bands by means of the thermal energy. The electron vacancies left behind in the valence bands are called holes. The number of such electrons and holes can be also controlled by intentionally doping semiconductors with impurities. When an external electric field is applied, the electrons and holes can move through the semiconductors, yielding a flow of electric current. Therefore, those electrons and holes are often called carriers. Because of various scattering mechanisms, the velocity of carriers saturates at a certain value called a drift velocity. The mobility is defined to be the magnitude of a drift velocity of carriers per unit electric field. A higher mobility can be achieved by 1) suppressing scattering events for carriers and 2) using carriers with a smaller effective mass. Carriers in a semiconductor with a smaller band gap usually have a smaller effective mass.

Crystals are components of devices which can be used in a variety of application fields, including electronics, opto-electronics, and magneto-electronics. The function of a crystalline device can often derive from a combination of crystals with different properties. Among the methods to integrate different crystals, epitaxial growth techniques are widely used because of their advantage in quality and cost. In epitaxial growth techniques, atoms are deposited on a crystalline substrate. Since the substrate acts as a template for the materials, the atoms are arranged in a crystalline form. If the grown crystal spreads over the substrate, it is called an epitaxial layer or epilayer. Depending on the growth condition and the choice of substrates, other forms of epitaxial crystals can be obtained. Epitaxial dots and wires are representatives of such crystals. An epitaxially grown crystal can act as a substrate for another epitaxial growth.

The lattice constant of a material is a temperature-dependent intrinsic property of the bulk form of that material. If an epitaxially grown crystal has a lattice constant different than the substrate, the difference between the two constants yields a lattice mismatch. A lattice mismatch, f, is usually defined to be $f=[LC_{sub}-LC_{epi}]/LC_{epi} \times 100(\%)$, where $LC_{sub}$ and $LC_{epi}$ are intrinsic lattice constants of the substrate and the epitaxially grown crystal, respectively. For an epitaxial growth with $f \neq 0\%$, the stress in an epitaxially grown crystal which strongly depends on the magnitude of f becomes larger as the thickness increases. When the thickness is small, the stress can be resolved by elastically deforming the unit cell of the epitaxially grown crystal, which results in the epitaxially grown crystal being strained. When the thickness becomes larger, the stress can reach a point where structural defects, such as dislocations and cracks, are created and elongated in the epitaxially grown crystal. The thickness at which this phenomenon occurs is usually called a critical thickness. Although a crystal can be grown epitaxially beyond a critical thickness in most of the cases, the quality of the epitaxial crystal is largely deteriorated due to structural defects. Structural defects can limit the performance of crystalline devices which use epitaxially grown crystals.

An example of an ordinary epitaxial growth is presented in FIG. 1. For simplicity, only the case for an epitaxial layer is shown. Layer 2 is epitaxially grown on a substrate, layer 1. Layer 1 can be either a thick continuous crystal or a crystal grown epitaxially on another crystal. In either case, the deformation of layer 1 is negligible. Therefore, the lattice mismatch between layer 1 and layer 2 can be calculated by using the intrinsic lattice constants for these layers. The thinner solid curve in FIG. 6 shows a typical critical thickness curve plotted as a function of lattice mismatch. The shape of curve can be altered depending on other parameters, such as the mechanical properties of layer 1, the types of structural defects, and the condition of epitaxial growth. FIG. 6 indicates that if layer 2 is an active (main) layer of a device, its thickness is effectively limited by the critical thickness. Beyond the critical thickness, structural defects that can lower the device performance are created. The critical thickness becomes smaller as the lattice mismatch increases.

It is often the case that the optimum epitaxial crystal thickness for device performance is thicker than the critical thickness for a given material combination. Moreover, the pursuit of improved device performance often dictates the use of new material combinations with a larger lattice mismatch, because this usually coincides with a desirable relationship in the difference of other material properties, such as band-gap. A larger lattice mismatch, however, incurs an even smaller critical thickness for the layered structures, as shown in FIG. 6. The presently disclosed and claimed invention can overcome the ordinary critical thickness limitation for structures used in a variety of applications. The thicker solid curve in FIG. 6 shows a possible shift in the critical thickness curve by the presently disclosed and claimed invention. Usually, the critical thickness is increased for the entire lattice mismatch range.

BRIEF SUMMARY OF THE INVENTION

The presently disclosed and claimed invention allows the formation of layers of different crystalline materials with lattice mismatches higher than the ordinary method, and allows growth of an active crystalline layer with a greater critical thickness without increasing the dislocation densities therein. Thus, the presently disclosed and claimed invention permits the use of a wider variety of crystalline materials used to form a desirable relationship by permitting the growth of an active crystalline layer sufficiently thick to perform its intended purpose. The presently disclosed and claimed invention suppresses or minimizes the creation of defects in the active crystalline layer when grown beyond the ordinary critical thickness. Each layer formed in the presently disclosed and claimed invention can be a compositionally uniform layer, a compositionally graded layer, and uniformly or partially doped layers.

In one embodiment, the presently disclosed and claimed invention is a low-defect-density crystalline structure. The structure is provided with a first crystalline material, a layer of a second crystalline material and a layer of a third crystalline material. The layer of second crystalline material is epitaxially grown on the first crystalline material. The layer of third crystalline material is epitaxially grown on the layer of second crystalline material such that the layer of second crystalline material is positioned between the first crystalline material and the layer of third crystalline material. The second crystalline material and the third crystalline material cooperate to form a desirable relationship. The first crystalline material and the third crystalline material have a crystalling compatibility greater than a crystalline compatibility of the second crystalline material and the third crystalline material The layer of second crystalline material is sufficiently thick to form the desirable relationship with the third crystalline material but also sufficiently thin for the layer of second crystalline material to be strained, therefore mimicking the crystalline structure of the first crystalline material. The layer of third crystalline material is grown to a thickness beyond a critical thickness had the third layer been grown on an unstrained second layer of the second material.

The low-defect-density crystalline structure is generally formed in 4 steps. First, crystalline materials are chosen that form a desirable relationship. The crystalline materials can have a lattice mismatch equal to or greater than what the original method would allow. This permits the use of a wider variety of crystalline materials than the original method since the presently disclosed and claimed method supports lattice mismatches typically up to several times larger than the original method. These chosen crystalline materials are used to form "second" and "third" crystalline layers as will be discussed below with the third crystalline layer being denoted by way of example as an "active" layer.

Second, a relaxed first crystalline material is chosen with a lattice constant between the lattice constants of the two other crystalline materials chosen for their desirable relationship. Then, one of the two crystalline materials forming the desirable relationship is epitaxially grown on the relaxed first crystalline material as the second crystalline layer, up to the ordinary critical thickness as determined by the lattice mismatch between the chosen second crystalline material and the first crystalline material. This results in a second layer being strained and mimicking the lattice structure of the first crystalline material. Finally, a third layer of crystalline material (i.e., the other one of the crystalline materials forming the desirable relationship) is epitaxially grown on the second layer—the critical thickness of the third layer is effectively calculated by using the lattice mismatch between the first crystalline material and the crystalline material forming the third layer. This is made possible by an elastic deformation occurring in the second layer, causing the lateral lattice constant of the second layer to be equal to or close to, i.e., "mimics," that of the relaxed first crystalline material. It should be understood that when referring to the second layer mimicking the relaxed first crystalline material, the degree of mimicking does not have to be absolute.

The presently disclosed and claimed invention is advantageous because commonly the thickness needed for an active layer is greater than the critical thickness of the third crystalline material grown on an unstrained second crystalline material due to the lattice constants or differing crystalline structures of the constituent layers. The ability to grow the active layer beyond a thickness allowable using the ordinary method is beneficial to devices using crystalline structures, for example. Also, many new devices are possible by using materials with larger lattice mismatch differences. Additionally, the presently disclosed and claimed invention can be used to improve current low-defect-density crystalline structures, and allow for previously impossible device designs. The low-defect-density crystalline structure can be used as a key component of a quantum well structure which is widely used in the field of electronics, opto-electronics, and magneto-electronics. The low-defect-density crystalline structure also enables quantum-well-based devices to operate at a higher speed yet with a lower power consumption, to operate at a wider frequency range of light detection and laser emission, and to detect light or magnetic fields with a higher sensitivity. The details about the application of the presently disclosed and claimed invention as a quantum well structure are explained in the sections of the alternate embodiments and the specific applications.

BRIEF DESCRIPTION OF THE SEVERAL VIEWS OF THE DRAWINGS

So that the above recited features and advantages of the presently disclosed and claimed invention can be understood in detail, a more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
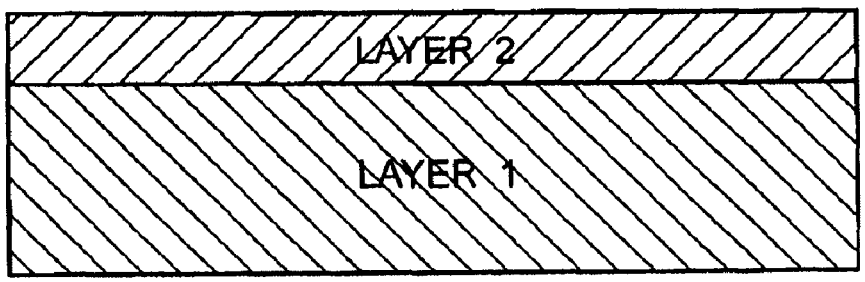
FIG. 1 is a representation of a prior art crystalline structure having a second layer grown on a first layer.

Presently preferred embodiments of the invention are shown in the above identified figures and described in detail below. In describing the preferred embodiments, like or identical reference numerals are used to identify common or similar elements. The figures are not necessarily to scale and certain features and certain views of the figures may be shown exaggerated in scale or in schematic in the interest of clarity and conciseness.

General Description/Considerations

Figure 2:
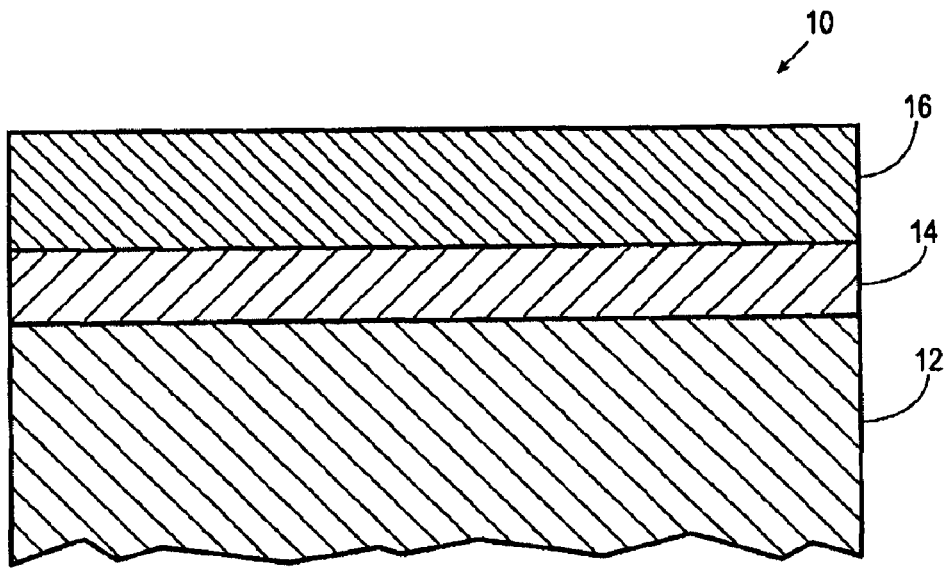
FIG. 2 is a representation of an exemplary crystalline structure constructed in accordance with the presently disclosed and claimed invention.

Referring now to the drawings and in particular to FIG. 2, shown therein and designated by reference numeral 10 is a low-defect-density crystalline structure 10 constructed in accordance with the presently disclosed and claimed invention. The low-defect-density crystalline structure 10 allows for the use of crystalline materials with lattice mismatches higher than the original method discussed above allows, and allows growth of an active layer with a greater critical thickness without increasing the dislocation densities therein.

The low-defect-density crystalline structure 10 is provided with a first crystalline material 12, a layer of second crystalline material 14 epitaxially grown on the first crystalline material 12, and a layer of third crystalline material 16 epitaxially grown on the layer of second crystalline material 14 such that the layer of second crystalline material 14 is positioned between the first crystalline material 12 and the layer of third crystalline material 16.

The second crystalline material 14 and the third crystalline material 16 cooperate to form a desirable relationship. A desirable relationship can be when the chosen crystalline materials possess optical, magnetic, electrical properties or the like which are desired in the low-defect-density crystalline structure 10.

The first step in forming the low-defect-density crystalline structure 10 is the selection of crystalline materials to be used. This selection is largely controlled by the intended application of the structure. Such as, when the low-defect-density crystalline structure 10 is used as a semiconductor device, some of the factors that may be considered are carrier mobilities of the constituent layers, the desirable relationship formed between the layer of second crystalline material 14 and the layer of third crystalline material 16 and the like.

Prior to the low-defect-density crystalline structure 10 described herein, a limitation in the selection of available crystalline materials was the lattice structure or lattice constant of each crystalline material. Where two given crystalline materials would otherwise be ideal for a given application because of their respective properties cooperating to form a desirable relationship, their respective lattice structures or lattice constants could otherwise limit the thickness of the active layer of crystalline material to a critical thickness which was insufficient for the active layer to perform its intended function. Thus, a desired combination of crystalline materials would otherwise have a low structural compatibility, because of the limitations on layer thickness resulting from the lattice mismatch. Prior to the presently disclosed and claimed invention, this low structural compatibility effectively operates to make the second crystalline material 14 and third crystalline material 16 incompatible for use together.

The crystalline structures of the second crystalline material 14 and the third crystalline material 16 have low structural compatibility. That is, the second crystalline material 14 and third crystalline material 16 have crystalline structures which are either a different type, or have lattice constants such that the critical thickness of the layer of third crystalline material 16 would limit the thickness to one that is insufficient to effectively provide its intended use. The low structural compatibility limits the thickness the layer of third crystalline material 16 grown on an unstrained layer of second crystalline material 14 to a critical thickness beyond which defects and/or dislocations in the crystalline structure would be formed, thus overcoming or substantially reducing the desirable relationship that otherwise exists between the second and third crystalline materials.

For example, in the semiconductor application, the thickness of the layer of third crystalline material 16 could be insufficient to flow a current fast enough for the application. This can be a critical problem, for example if the third layer is used as the electron conduction layer or active layer of high electron mobility transistors.

The crystalline structures of the first crystalline material 12 and third crystalline material 16 have a higher compatibility. This higher structural compatibility operates to make the first crystalline material 12 and third crystalline material 16 more compatible for use together than the second crystalline material 14 and the third crystalline material 16. That is, the critical thickness of the layer of third crystalline material 16 grown directly on an unstrained first crystalline material 12 exceeds the critical thickness of the layer of third crystalline material 16 grown directly on an unstrained second crystalline material 12. Therefore, by maintaining the layer of second crystalline material 14 in a strained state whereby it mimics, at least to some degree, the crystalline structure of the first crystalline material 12, the layer of third crystalline material 16 can be grown to a critical thickness as if it had been grown directly on the first crystalline material 12. Thus, the layer of third crystalline material 16 can be grown to a thickness where it can perform its intended use.

The layer of second crystalline material 14 is sufficiently thick to form the desirable relationship with the layer of third crystalline material 16 but sufficiently thin for the layer of second crystalline material 14 to be strained, therefore mimicking the crystalline structure of the first crystalline material 12. Thus, the low-defect-density crystalline structure 10 is typically formed of three different types of crystalline material but the layer of second crystalline material 14 is formed such that the low-defect-density crystalline structure 10 operates as if the layer of third crystalline material 16 had been grown directly on the first crystalline material 12 while maintaining the desirable relationship between the layer of second crystalline material 14 and the layer of third crystalline material 16.

In another aspect, the presently disclosed and claimed invention relates to a method of forming the low-defect-density crystalline structure 10. In general, the first crystalline material 12 is provided, and then a strained layer of the second crystalline material 14 is epitaxially grown on the first crystalline material 12 such that the layer of second crystalline material 14 adopts, to some degree, the crystalline structure of the first crystalline material 12. Then, a layer of a third crystalline material 16 is epitaxially grown on the strained layer of second crystalline material 14 wherein the third layer is grown beyond a critical thickness had the layer of the third crystalline material 16 been epitaxially grown on an unstrained layer of the second crystalline material 14.

When the materials used for layers 12, 14 and 16 belong to the same type of crystals, the condition of the choice of these materials can be expressed simply by using the lattice constant. The lattice constant of the first crystalline material 12 is between the lattice constant of the second crystalline material 14 and the lattice constant of the third crystalline material 16 (i.e., $LC_2>LC_1>LC_3$ or $LC_3>LC_1>LC_2$ where $LC_1$ represents the lattice constant of the first crystalline material 12, $LC_2$ represents the lattice constant of the second crystalline material 14, and $LC_3$ represents the lattice constant of the third crystalline material 16).

The thickness of the layer of second crystalline material 14 is generally less than its critical thickness when grown on the first crystalline material 12. The thickness of the layer of second crystalline material 14 is determined as to minimize crystalline defects at the epitaxial interface between the first crystalline material 12 and the layer of second crystalline material 14.

The third layer of crystalline material 16 is desirably grown beyond its critical thickness had it been grown on an unstrained layer of the second crystalline material 14. Simply put, had the second layer of crystalline material 14 been grown sufficiently thick to adopt its natural crystalline structure, and thus become unstrained, the resulting critical thickness of the third layer of crystalline material 16 would be substantially less than when the layer of second crystalline material 14 is strained, or rather mimics the lattice structure of the first crystalline material 12. This results in the ability to grow the third layer of crystalline material 16 thicker than was possible using the ordinary method.

The low-defect-density crystalline structure 10 can be formed by methods of epitaxial growth known in the art. For example, the structure can be formed by physical vapor deposition, chemical vapor deposition, molecular beam epitaxy, plasma deposition, sputter deposition, electrochemical deposition, wet deposition, dry deposition, chemical synthesis or the like.

The low-defect-density crystalline structure 10 described herein is compatible with pre and post-processes. For example, thermal treatment (annealing), aging, chemical treatment, ion implantation, patterning (fabrication of mesa structure), wet etching, dry etching, wiring, packaging and the like. Also, the structure can be cut and thinned.

It should be noted that references to the presently disclosed and claimed invention have indicated that the layer of third crystalline material 16 is considered as the active layer, for example. However, it should be understood that the layer of third crystalline material 16 does not necessarily have to be the active layer and that other layers can be assigned as the active layer, depending of the purpose and operation of the structure 10. As would be understood by one having ordinary skill in the art, any of the layers 12, 14 and 16 can be used as the active layer.

It has been found that the presently disclosed and claimed invention is effective in suppressing the creation of additional structural defects in situations where there are defects on the surface of a substrate. For example, where there are defects on the surface of a substrate (i.e., where the first crystalline material 12 possesses defects on its surface), the degree of epitaxy may not be perfect throughout the structure (i.e., an epitaxial growth may not occur on the defective portion of substrate). The presently disclosed and claimed invention suppresses the creation of additional structural defects in the epitaxial layer. By way of another example, the crystalline material may contain structural defects such as dislocations, twins, cracks, voids, precipitates, poly-crystalline regions, and amorphous regions. The presently disclosed and claimed invention has been found to eliminate or minimize the increase in structural defect density in the epitaxial components above the first crystalline material 12.

As is known in the art, there are two concepts for critical thickness. One concept refers to static balance between the energy required to create a misfit segment and the mechanical energy lowered by this creation. In practice, strained epitaxial components can be grown up to another critical thickness beyond the static limit, because of the kinetic nature of epitaxial growth. The increase in critical thickness depends on the epitaxial process and growth conditions. Therefore, many metastable growth techniques have been proposed to obtain a larger kinetic critical thickness. Since the presently disclosed and claimed inventive method increases the static critical thickness, an increase in the kinetic critical thickness by any metastable growth technique is expected. Although a difference may already exist between the actual static critical thickness and theoretical estimates (see for example, J. W. Matthews and A. E. Blakeslee, J. Cryst. Growth 27, 118 (1974) and A. Fischer et al., Phys. Rev. B 54, 8761 (1996)) for a particular materials system, the invented method can further increase any actual static critical thickness.

The presently disclosed and claimed inventive method can be applied to increase the critical thickness of the layer of third crystalline material 16. However, this does not impose any thickness restrictions for devices incorporating the presently disclosed and claimed invention. The suppression in structural defect creation can occur in epitaxial structures both thinner and thicker than the critical thickness realized in the presently disclosed and claimed invention, compared to the ordinary method. For example, when the layer of third crystalline material 16 is thinner than the new critical thickness, no additional defects are created. When the layer of third crystalline material 16 is thicker than the new critical thickness, a smaller amount of defect creation can be expected, compared to the ordinary method.

The following descriptions and references to the low-defect-density crystalline structure 10 are provided to more fully enable the presently disclosed and claimed invention. To provide consistency, the low-defect-density crystalline structure 10 is described for use in a semiconductor application. However, as is more fully explained below, the presently disclosed and claimed invention can be used in a variety of applications and each application presents different considerations.

Uses

The low-defect-density crystalline structure 10 described herein is capable of use in many applications. Not by way of limitation, the low-defect-density crystalline structure 10 can be used to form a semiconductor device, a transistor, an opto-electrical device, a magneto-electronic device, a nano-electromechanical device, a micro-electromechanical device, a surface coating, a catalyst and the like. However, the presently disclosed and claimed invention could be beneficial to any application involving the use of crystalline structures.

Method of Forming

By way of reference, a particular method of forming the low-defect-density crystalline structure 10 is described below. However, the exact manner of forming the low-defect-density crystalline structure 10 can be altered depending on the chosen application. As is described above, the specific application may determine which crystalline materials are selected. As is understood by one having ordinary skill in the art, different crystalline materials require different methods of, or conditions for, epitaxial growth. Growth parameters such as temperature, time in preparation and the like vary between crystalline materials. Therefore, the specific method described below is presented by way of reference only and should not be read to limit the scope of the presently disclosed and claimed invention in any manner.

Selecting the Materials

The first step in forming the low-defect-density crystalline structure 10 is selecting the crystalline materials to be used. As is described above, the selection of crystalline materials will typically be determined by the application of the structure. The crystalline materials will be chosen so that they cooperate to form the desirable relationship described above. In this example, the structure will be used as a semiconductor device. When the low-defect-density crystalline structure 10 is to be used as a semiconductor device, factors that may be considered when selecting materials to be used are carrier mobility and electronic band structure of the constituent layers, the desirable relationship formed by the layer of second crystalline material 14 and the layer of third crystalline material 16 and the like. For example, so long as epitaxial growth takes place to some extent, any combinations of materials which may have a different crystalline structure may be used for the crystalline materials.

After considering these factors, the semiconductor device might be formed of any semiconductor materials, including Si, Ge, SiGe, SiC, GaAs, AlAs, InAs, GaP, AlP, InP, GaSb, AlSb, InSb, GaN, AlN, InN, ZnSe, CdTe and the alloys among them. As would be understood by one having ordinary skill in the art, some combinations of the crystalline materials listed above could not otherwise be compatible in an actual crystalline layered structure using the ordinary method due to the critical thickness limitation discussed above. However, the presently disclosed and claimed invention permits the use of crystalline materials having lattice mismatches beyond that supported by the ordinary method.

These crystalline materials, when used in a single semiconductor device, provide a wider frequency range of light emission and detection, a more sensitive light and magnetic field detection, a higher carrier confinement, higher carrier mobility, a higher operating speed and so on.

As would be understood in the art, the crystalline materials chosen to form the low-defect-density crystalline structure 10 can be semiconductor, metal, dielectric, superconductor, magnetic, ferroelectric, piezoelectric, hybrid thereof or the like. As explained above, the crystalline materials selected to form the low-defect-density crystalline structure 10 will depend on the intended application.

Each layer of crystalline materials formed in the art of the presently disclosed and claimed invention can take any type of crystal structure, including diamond, zinc-blende, wurtzite structures and the like. In addition, the layer can be any type of crystal form, including a single crystal, poly-crystal, a compositionally uniform crystal, a compositionally graded crystal, uniformly or partially doped crystal, crystals that contain structural defects, and the like.

Forming a First Layer

Figure 3:
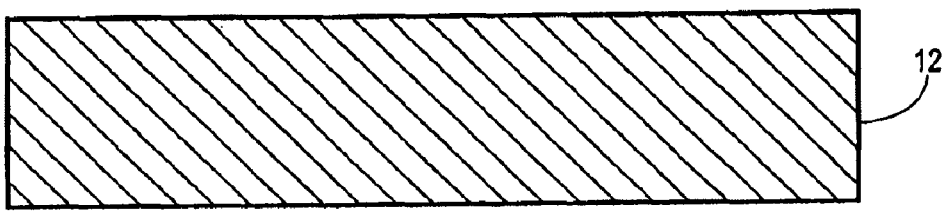
FIG. 3 is a representation of an exemplary first crystalline material used in the presently disclosed and claimed invention.

The second step in forming the low-defect-density crystalline structure 10 is forming the first crystalline material 12, as is shown in FIG. 3. The first crystalline material 12 can be formed from a substrate or an epitaxially grown layer. By way of example, the first crystalline material 12 can be formed of $Al_{0.1}In_{0.9}Sb$ or the like. Additionally by way of example, the first crystalline material can be formed as a layer using molecular beam epitaxy.

It has been found that the material chosen to form the first crystalline material 12 does not have to be perfectly crystalline. For example, and not by way of limitation, the first crystalline material can be formed of a single crystal, compositionally graded crystal, doped crystal, poly-crystal, oriented texture crystal or the like.

As was described above, when the materials used for layers 12, 14 and 16 belong to the same type of crystals, the lattice constant of the first crystalline material 12 will be between the lattice constant of the layer of second crystalline material 14 and the lattice constant of the layer of third crystalline material 16.

For the semiconductor application, the thickness of the first crystalline material 12 is typically in the order of sub-mm or less. However, there is no limitation for the thickness of the first crystalline material 12.

Forming a Second Layer

Figure 4:
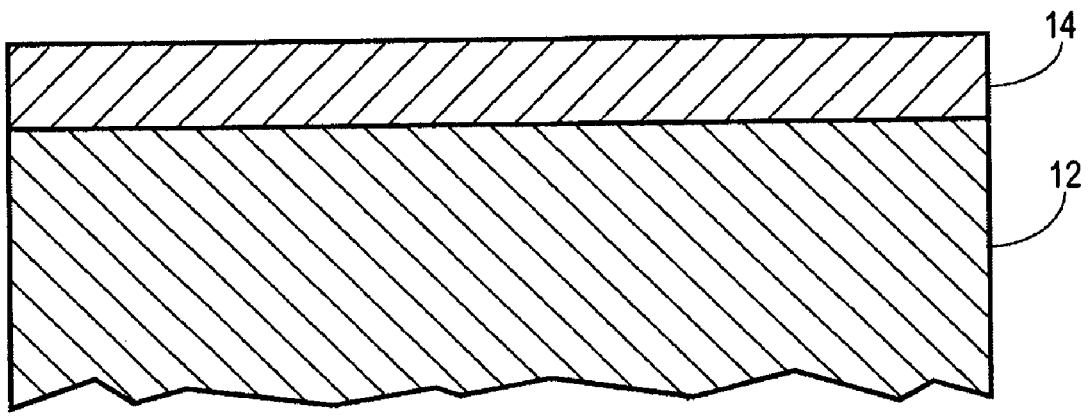
FIG. 4 is a representation of the first crystalline material and a layer of second crystalline material grown on the first crystalline material and used in an embodiment of the presently disclosed and claimed invention.

The layer of second crystalline material 14 is epitaxially grown on the first crystalline material 12, as is shown in FIG. 4. By way of example, the layer of second crystalline material 14 can be formed of $Al_{0.2}In_{0.8}Sb$ and the growth temperature can be 420° Celsius.

As described above, the thickness of the layer of second crystalline material 14 is limited to its critical thickness, resulting in the layer of second crystalline material 14 being strained. The critical thickness for the layer of second crystalline material 14 is determined dominantly by the lattice mismatch between the first crystalline material 12 and the layer of second crystalline material 14. For the case that a crystal is epitaxially grown on a crystalline substrate with the same crystalline structure as the substrate, a common equation used in the art to determine the static critical thickness for dislocations is defined by the following equation:

$$h_c = \frac{b}{2\pi f} \frac{(1 - \upsilon\cos^2\alpha)}{(1 + \upsilon)\cos\lambda} \left(\ln\frac{h_c}{b} + 1\right)$$

where $h_c$ is the critical thickness, b is the magnitude of Burgers vector, f is the lattice mismatch, $\upsilon$ is the Poisson ratio, $\alpha$ is the angle between the dislocation line and its Burgers vector, $\lambda$ is the angle between the slip direction and that direction in the film plane which is perpendicular to the line of intersection of the slip plane and the interface, according to J. W. Matthews and A. E. Blakeslee [J. Cryst. Growth 27, 118 (1974)].

Forming a Third Layer

The layer of third crystalline material 16 is epitaxially grown on the layer of second crystalline material 14 such that the layer of second crystalline material 14 is positioned between the first crystalline material 12 and the layer of third crystalline material 16, as is shown in FIG. 2. By way of example, the third crystalline material can be InSb and the growth temperature can be 420° Celsius. The layer of third crystalline material can be formed by using molecular beam epitaxy.

As described above, the thickness of the layer of third crystalline material 16 exceeds the critical thickness had the layer of third crystalline material 16 been grown on an unstrained layer of second crystalline material 14. For the crystalline materials chosen for the semiconductor application, the resulting critical thickness of the layer of third crystalline material 16 could be increased typically up to several times larger than the original method.

For a particular application, the layer of third crystalline material 16 could be further modified subsequent to being formed. One example of modification is where the layer of third crystalline material 16 is etched to form a desired pattern of semiconductor material, conductive path, optical waveguide or the like. As another example, if the low-defect-density crystalline structure 10 was being used to form a microprocessor, the elements necessary to form a microprocessor could be formed on the layer of third crystalline material 16 by etching techniques known in the art. For example, the layer of third crystalline material 16 could be etched by wet technique, dry technique, or the like. A deposition of an amorphous layer on top of the third crystalline material 16 is possible without deteriorating the low-defect-density crystalline structure 10. Such an amorphous layer can be used as a gate dielectric layer which is an important component for a field effect transistor and the like. Crystalline layers can also be grown on the layer of the third crystalline material 16 without creating structural defects, by using a procedure to be mentioned later in the alternate embodiments. The crystalline layers can be used as electrodes and capping layers.

Figure 7:
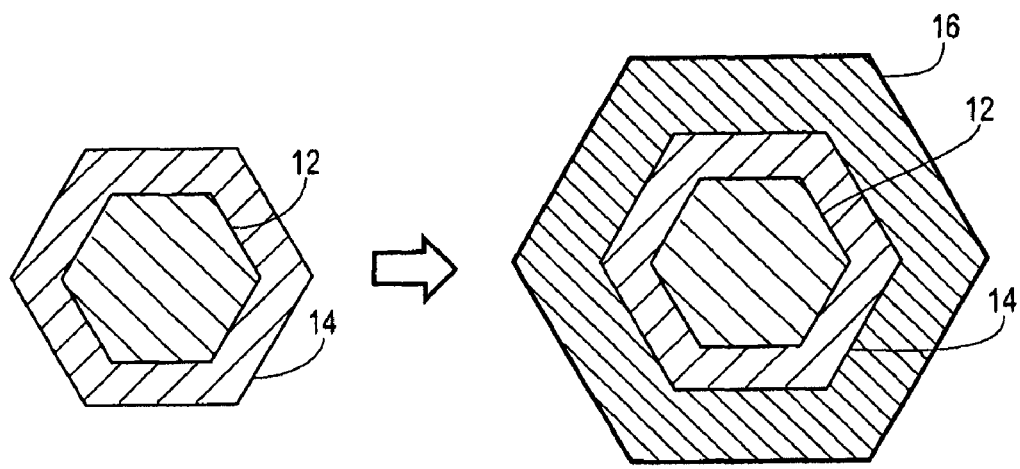
FIG. 7 is a representation of an exemplary crystalline structure in accordance with the presently disclosed and claimed invention where crystalline layers are formed on more than one surface of a starting crystalline structure.

The low-defect-density crystalline structure 10 has generally been described above as crystalline materials formed into a layered geometry. However, it should be noted that the presently disclosed and claimed invention can be applicable to any epitaxial structure in zero-dimensional (e.g., dot), one-dimensional (e.g., wire), two-dimensional (e.g., planar), and three-dimensional (e.g., polygonal, arcuate and spherical surfaces) geometries. For example, the method can be applied to quantum dots using colloidal techniques or to epitaxial structures grown on patterned substrates. An example of the presently disclosed and claimed invention where the low-defect-density crystalline structure 10 is formed on a two-dimensional or three-dimensional surface is presented in FIG. 7. As can be seen, the layer of second crystalline material 14 is epitaxially grown on the first crystalline material 12. Next, the layer of third crystalline material 16 is epitaxially grown on the layer of second crystalline material 14.

Additionally, the low-defect-density crystalline structure 10 can be formed with additional layers. For example, the structure can be formed with doping layers and amorphous layers embedded therein.

As mentioned above, the low-defect-density crystalline structure 10 has several conditions about the choice of materials and about the layer thickness which may limit the vertical size of the structure. However, there is no size limit for the lateral dimension. Therefore, the low-defect-density crystalline structure 10 with an extremely large or small lateral size can be grown. Additionally, the structure can be grown and cut in a variety of lateral shapes.

Alternate Embodiments

Figure 5:
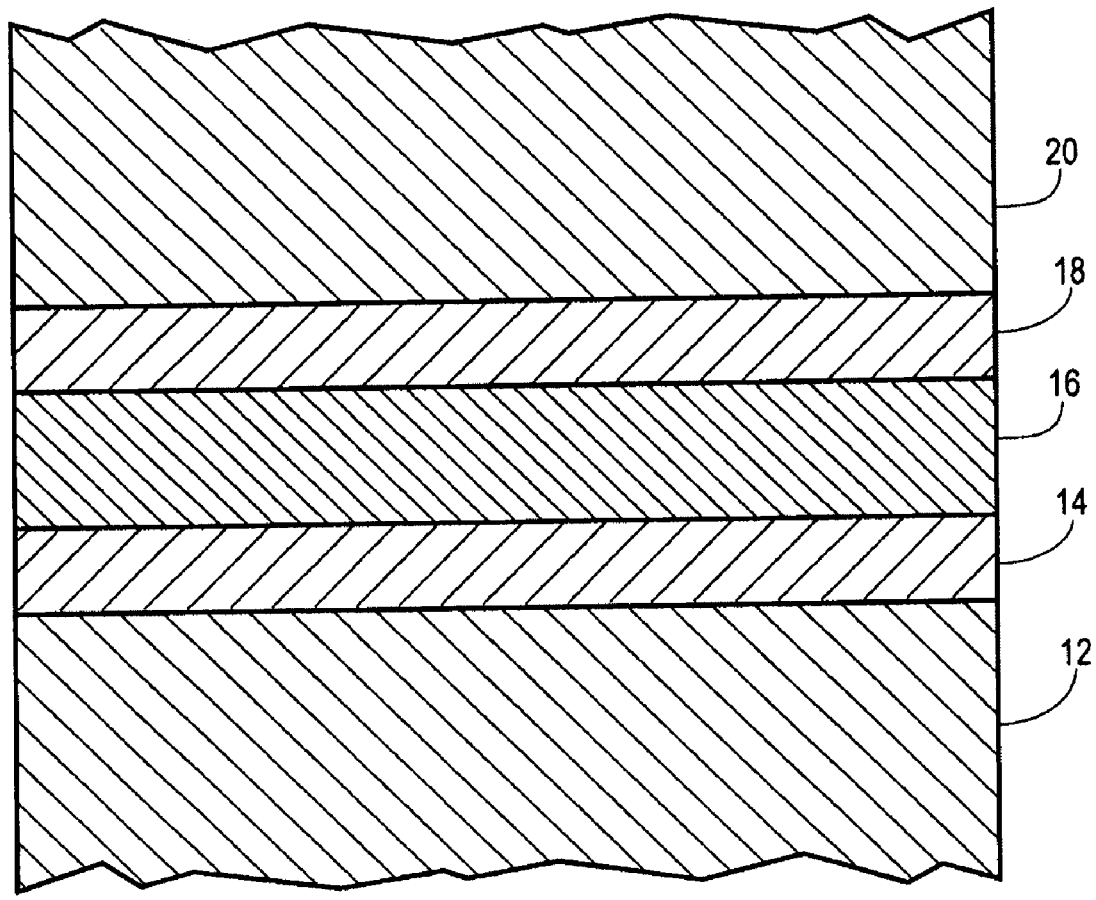
FIG. 5 is a representation of an alternate embodiment of a crystalline structure constructed in accordance with the presently disclosed and claimed invention.
Figure 6:
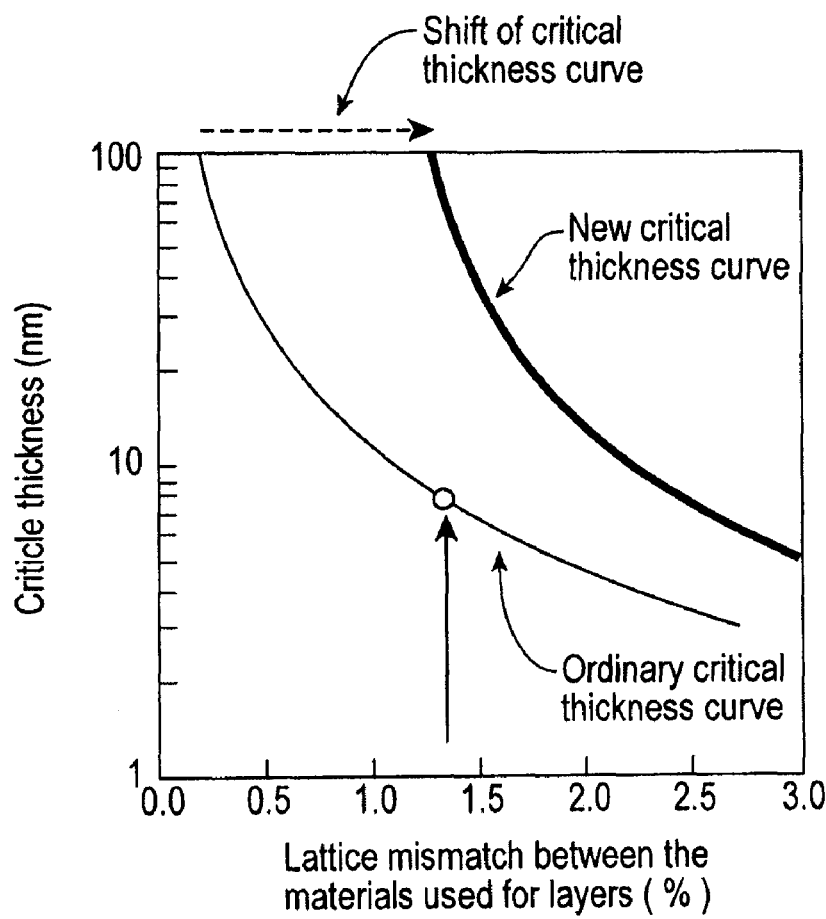
FIG. 6 is a chart representing a shift of a critical thickness curve as a function of a lattice mismatch between epitaxially grown layers.

An alternate embodiment of the presently disclosed and claimed invention is described herein and is shown in FIG. 5. In this alternate embodiment, the low-defect-density crystalline structure 10 is further provided with a layer of fourth crystalline material 18 and a layer of fifth crystalline material 20.

In the instance where the layer of third crystalline material 16 was further modified after formation, as was described above, the process of modification would be typically completed prior to forming the alternate embodiment described herein. For example, when the presently disclosed and claimed invention is to be used to form a microprocessor, the elements of the microprocessor would be formed on the layer of third crystalline material 16 prior to epitaxially growing the fourth layer of crystalline material 18. However, such modifications can also be made after growing the fourth or higher layer.

In this alternate embodiment, the low-defect-density crystalline structure 10 is formed with at least one additional layer. Although in this alternate embodiment, two additional layers are provided to the low-defect-density crystalline structure 10, further stacking of additional layers can be formed, as will be understood by one having ordinary skill in the art. The criterions for material choice and critical thickness are identical for all the even and odd layers, which is to be described for the fourth and fifth layers as example. Multi-stacking quantum wells and distributed Bragg reflector mirrors are some of the examples that can be grown with multi stacking structures by the presently disclosed and claimed invention.

The alternate embodiment can provide the low-defect-density crystalline structure 10 with increased structural stability. The layers added by the alternative embodiment can also be used as electrodes to the crystalline structure 10. Another purpose could be to provide a protective shield to the third layer of crystalline material 16. Other benefits may be realized by the addition of the fourth and fifth layers of crystalline material as will be understood by one having ordinary skill in the art.

As stated in the section of the detailed description of the invention, each layer of crystalline materials formed in the art of the presently disclosed and claimed invention can take any type of crystal structure, including diamond, zinc-blende, wurtzite structures and the like. In addition, the layer can be any type of crystal form, including a single crystal, poly-crystal, a compositionally uniform crystal, a compositionally graded crystal, uniformly or partially doped crystal, and crystals that contain intrinsic structural defects.

For purposes of simplification, the following alternate embodiment is described as a continuation of the specific application described above where the low-defect-density crystalline structure 10 is used to form a semiconductor device. However, this specific application should not be read in any way to limit the scope of the presently disclosed and claimed invention, or alternate embodiments thereof in any manner.

Forming a Fourth Layer

In this alternate embodiment, the layer of fourth crystalline material 18 is epitaxially grown on the layer of third crystalline material 16 such that the layer of third crystalline material 16 is positioned between the layer of second crystalline material 14 and the layer of fourth crystalline material 18. The layer of fourth crystalline material 18 is formed by methods known in the art and described above.

To suppress or minimize the creation of structural defects in the fourth crystalline layer material 18, the following criterions need to be satisfied. When the lattice constant of the second crystalline material 14 is larger (smaller) than that of the first crystalline material 12, the lattice constant of the fourth crystalline material 18 may be chosen to be larger (smaller) than or equal to that of the first crystalline material 12. (i.e., When $LC_2 > LC_1$, then $LC_4 \geq LC_1$. Or, when $LC_1 > LC_2$, then $LC_1 \geq LC_4$. Where $LC_1$ represents the lattice constant of the first crystalline material 12, $LC_2$ represents the lattice constant of second crystalline material crystalline material 14, and $LC_4$ represents the lattice constant of the third crystalline material 18). The layer of fourth crystalline material 18 can be grown to a critical thickness as determined dominantly by the lattice mismatch between the first and fourth crystalline material 12 and 18, since the third crystalline material 16 is strained such that it has effectively the same lattice spacing as the lattice constant of the first crystalline material 12, due to the art of the presently disclosed and claimed invention. However, a fourth crystalline material 18 that does not satisfy the above criterions about lattice constants can also be grown, especially if the defects in the fourth crystalline layer are of no importance. Even in this case, the performance of the device made out of the low-defect-density crystalline structure 10 which has a defective fourth layer 18 can be improved, since structural defects in the active layer, possibly the third crystalline material 16, have already been suppressed by the presently disclosed and claimed invention. Therefore, the above criterions should not be read to limit the scope of the presently disclosed and claimed invention in any manner.

The layer of fourth crystalline material 18 can be formed of substantially the same crystalline material as is used in the layer of second crystalline material 14. This choice of the fourth crystalline material 18 satisfies the aforementioned criterion for the fourth crystalline material 18. Advantages to forming the layer of fourth crystalline material 18 of substantially the same material could be an improvement or enhancement of the desirable relationship formed between the second crystalline material 14 and third crystalline material 16. When the third crystalline material 16 is used as a carrier path and the second and fourth crystalline materials 14 and 18 act as barrier layers that prevent carriers escaping from the carrier path, the use of the fourth crystalline material 18 enhances the confinement of carriers.

However, it is not required that the layer of fourth crystalline material 18 be composed of substantially the same crystalline material as the layer of second crystalline material 14 and this option should not read to limit the scope of the presently disclosed and claimed invention in any manner.

Alternatively, the crystalline material selected to form the layer of fourth crystalline material 18 could be selected to provide other benefits to the low-defect-density crystalline structure 10. Such as, the selection of the fourth crystalline material 18 could be chosen to provide additional desirable relationships with the layer of third crystalline material 16 outside of, or in addition to, the desirable relationship formed between the layer of second crystalline material 14 and layer of third crystalline material 16. For example, such a structure can be used to grow an asymmetric quantum well structure which may be beneficial to a higher carrier confinement.

Forming a Fifth Layer

In this alternate embodiment, a layer of fifth crystalline material 20 is epitaxially grown on the layer of fourth crystalline material 18 such that the layer of fourth crystalline material 18 is positioned between the layer of fifth crystalline material 20 and the layer of third crystalline material 16. The layer of fifth crystalline material 20 is formed by methods known in the art and described above. If the fourth crystalline material 18 is grown according to the criterion above, the creation of defects by the formation of the fifth crystalline material 20 on such a fourth layer can be avoided by obeying the following criterion for the material choice and critical thickness below. The lattice constant of the fourth crystalline material 20 may be chosen to be larger (smaller) than or equal to that of the first crystalline material 12, when the lattice constant of the third crystalline material 16 is larger (smaller) than that of the first crystalline material 12. (i.e., When $LC_3 > LC_1$, then $LC_5 \geq LC_1$. Or, when $LC_1 > LC_3$, then $LC_1 \geq LC_5$. Where $LC_1$ represents the lattice constant of the first crystalline material 12, $LC_3$ represents the lattice constant of second crystalline material crystalline material 16, and $LC_5$ represents the lattice constant of the third crystalline material 20). The layer of fifth crystalline material 20 can be grown to a critical thickness as determined dominantly by the lattice mismatch between the first and fifth crystalline material 12 and 20, since the fourth crystalline material 18 mimics the crystalline structure of the first crystalline material 12. However, a fifth crystalline material 20 that does not follow the above criterion can also be grown without significantly deteriorating the quality of the third crystalline material, due to a similar reason mentioned for the fourth crystalline layer 18.

The layer of fifth crystalline material 20 can be formed of substantially the same crystalline material as is used in the first crystalline material 12. Advantages to forming the layer of fifth crystalline material 20 of substantially the same material could be an enhanced structural stability for the low-defect-density crystalline structure 10. By regarding the fifth crystalline layer 20 as a substrate, another low-defect-density crystalline structure 10 can be grown. By repeating this process, a multi-stacking structure with a repetition unit of a low-defect-density crystalline structure 10 can be grown. Each low-defect-density crystalline structure 10 can be formed to be identical or different with each other. However, it is not required that the layer of fifth crystalline material 20 be composed of substantially the same crystalline material as the first crystalline material 12 and this option should not read to limit the scope of the presently disclosed and claimed invention in any manner. For instance, when the layer of fifth crystalline material 20 is formed of substantially the same crystalline material as is used in the first crystalline material 12, another type of multi-stacking structure with two repetitive materials can be formed. In addition to the two types of multi-stacking structures, a variety of multi-stacking structure can be grown by using the presently disclosed and claimed invention. As mentioned previously, the criterions for material choice and critical thickness are identical for all the even and odd layers, which are described for the fourth and fifth layers as example. The multi-stacking low-defect-density crystalline structures can be used as several important semiconductor structures, such as multi-stacking quantum wells and distributed Bragg reflection mirrors.

For example, InSb quantum well samples have been grown in accordance with the presently disclosed and claimed invention using the following conditions: sample growth technique is molecular beam epitaxy; the structure grown was a "single sandwich structure" as is represented in FIG. 5; the substrate on which the first crystalline material 12 was grown on was GaAs (001); the first crystalline material 12 and fifth crystalline material 20 are formed of $Al_{0.1}In_{0.9}Sb$; the second crystalline material 14 and fourth crystalline material 18 are formed of $Al_{0.2}In_{0.8}Sb$; the third crystalline material 16 is formed of InSb; and the growth temperature was 420° Celsius.

Specific Applications

As was demonstrated above when describing the formation of a semiconductor device using the low-defect-density crystalline structure 10, the device can be used in numerous applications. Some applications will be described below, but this description is not exhaustive and therefore should not be read to limit the scope of the presently disclosed and claimed invention in any way. The description below will be mainly regarding the low-defect-density crystalline structure 10. However, the representative application devices can be made with any structures mentioned in the alternate embodiments, such as a low-defect-density crystalline structure 10 covered with the fourth crystalline material 18 or with the fourth and fifth crystalline materials 18 and 20, and a multi-stacking of low-defect-density crystalline structures 10.

Quantum Well

The low-defect-density crystalline structure 10 can be applied to a quantum well. The basic low-defect-density crystalline structure 10 can be regarded as three different types of quantum well structures which have one of the three crystalline materials, 12, 14 and 16, as an active layer. Additionally, if desired, the alternative embodiment described above could be employed in the quantum well application to provide the benefits described therein. There are a variety of quantum well structures that can be formed by the alternative embodiments. For example, a quantum well with a double barrier can be formed by regarding the third crystalline material 16 as an active layer and the crystalline materials 14 and 18 as barrier layers, respectively, for the crystalline structure shown in FIG. 5. The structure in FIG. 5 can also be considered as a double quantum well structure by assigning the crystalline materials 14 and 18 as active layers and the remaining layers as barrier layers. Multi-stacking quantum wells are also formed by adding more crystalline layers. To the crystalline structures mentioned above, methods common in the art can be used to add other components which are necessary to flow and control carriers in a quantum well. Those components include gate dielectrics, electrodes, wirings, and capping layers. If the additional components are made out of crystalline materials, they may need to be deposited by the method claimed in the presently disclosed and claimed invention. In this application, the quantum well would benefit from the desirable relationship formed between the constituent crystalline layers and would further benefit from the increased thickness of some layers.

As would be understood by one having ordinary skill in the art, a quantum well with a higher carrier mobility, a higher carrier density, and a wider tunable range of sub-band energies can be realized by the presently disclosed and claimed invention. These benefits are applicable to any type of quantum-well-based semiconductor device in the fields of electronics, opto-electronics and magneto-electronics.

Microprocessor

Another application of the presently disclosed and claimed invention is when the low-defect-density crystalline structure 10 is used to form a microprocessor. In this application, after the layer of third crystalline material 16 is formed, methods common in the art can be used to form the microprocessor elements on or in the layer of third crystalline material 16. For example, through etching methods, circuits, components, conductive paths and the like could be formed on the layer of third crystalline material 16. In this application, the microprocessor would benefit from the desirable relationship formed between the layer of second crystalline material 14 and layer of third crystalline material 16 and would further benefit from the increased thickness of the layer of third crystalline material 16. Additionally, if desired, the alternative embodiment described above could be employed in the microprocessor application to provide the benefits described therein. The aforementioned usage of the low-defect-density crystalline structure 10 and its extended forms as a quantum well structure can play a significantly important role for the application of microprocessors.

As would be understood by one having ordinary skill in the art, a microprocessor with a higher operation speed yet with a low power consumption can be realized by the presently disclosed and claimed invention.

High Electron Mobility Transistor

In another application, the low-defect-density crystalline structure 10 could be used to form a High Electron Mobility Transistor (HEMT). The basic structure can be formed by using a low-defect-density crystalline structure 10 as a single quantum well structure. If necessary, a quantum well structure provided by the alternative embodiment could be used as a HEMT. In this application, two electrodes (source and drain) and a gate dielectric layer with a third electrode are attached to the crystalline structure.

Figure 8:
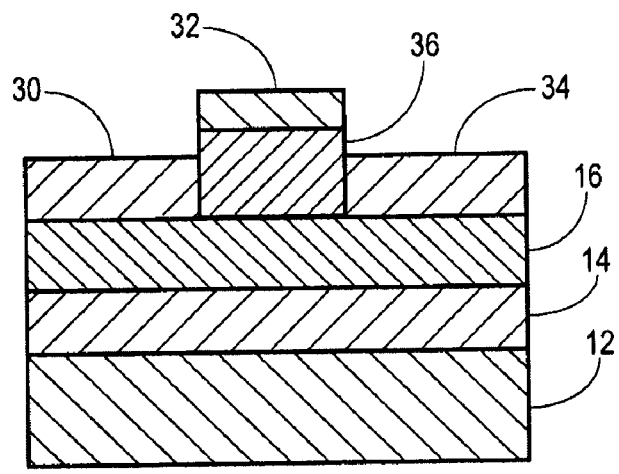
FIG. 8 is a representation of an exemplary crystalline structure in accordance with the presently disclosed and claimed invention where the crystalline structure forms a high electron mobility transistor.

An embodiment of the low-defect-density crystalline structure 10 used to form a HEMT is presented, by way of an example, in FIG. 8. In this example, the structure includes a source electrode 30, a gate electrode 32, a drain electrode 34, and a gate dielectric 36 in addition to the first, second, and third crystalline materials 12, 14, and 16.

Other advantages of using the presently disclosed and claimed invention to form a HEMT include a higher electron mobility and operation speed.

Opto-Electronic Device

Figure 9:
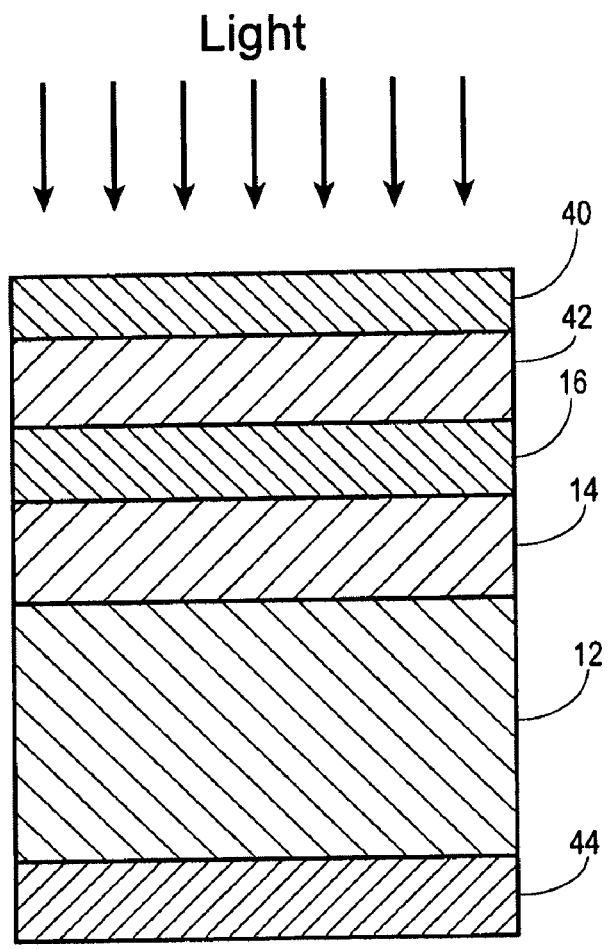
FIG. 9 is a representation of an exemplary crystalline structure in accordance with the presently disclosed and claimed invention where the crystalline structure forms an opto-electronic device.

In yet another application, the low-defect-density crystalline structure 10 could be used to form an opto-electronic device. For example, the low-defect-density crystalline structure 10 can be used as an active part of a heterojunction solar cell as shown in FIG. 9. In this example, the structure 10 includes an anti-reflection coating 40, a transparent front electrode 42, and a back electrode 44 in addition to the first, second, and third crystalline materials 12, 14, and 16. The first crystalline layer 12 can be assigned as a p-type anode region and the second and/or third crystalline layers 14 and 16 as an n-type cathode with the addition of other components, such as metallic contacts and antireflection coatings. Other examples include quantum-well-based light detectors and laser emitters, such as quantum cascade lasers, quantum cascade detectors, and vertical-cavity surface-emitting lasers.

The structure 10 can be used to form a solar cell having a higher conversion efficiency. As mentioned previously, the presently disclosed and claimed invention provides a wider range of sub-band energy in a quantum well. Therefore, a wider frequency range of light detection and laser emission can be achieved for quantum-well-based light detectors and laser emitters, respectively.

Magneto-Electronic Device

Figure 10:
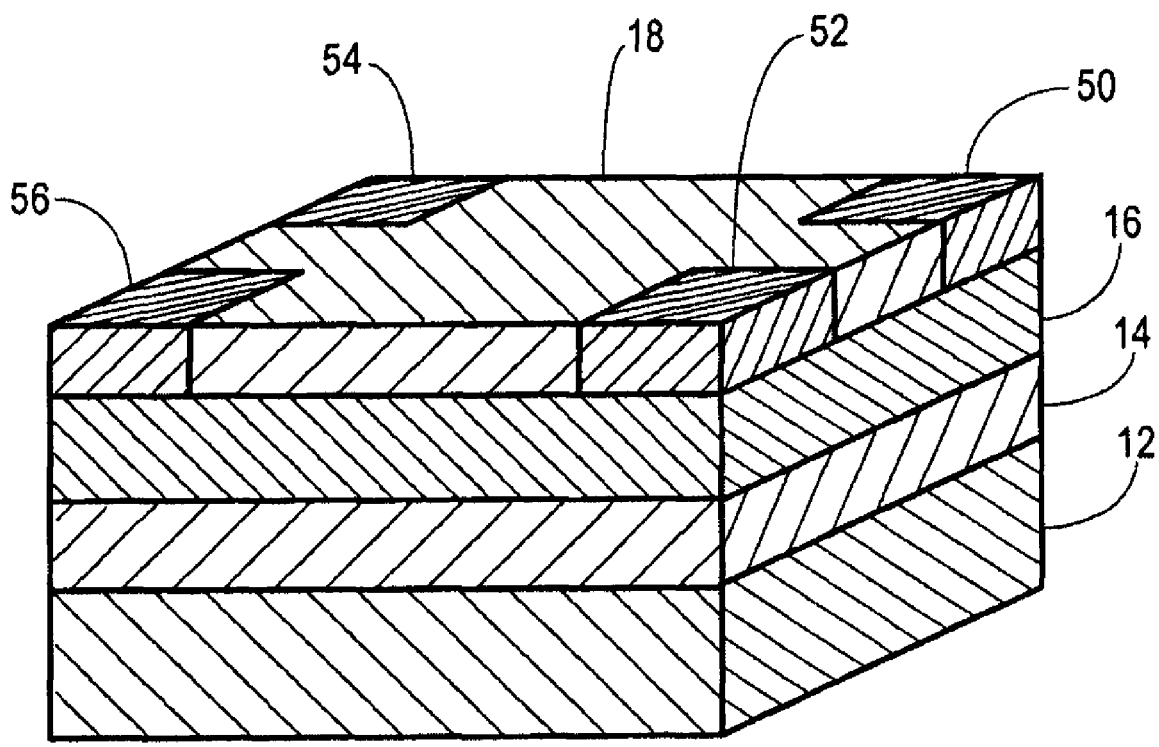
FIG. 10 is a representation of an exemplary crystalline structure in accordance with the presently disclosed and claimed invention where the crystalline structure forms an electro-magneto device.

In another application, the presently disclosed and claimed invention can be used to form a magneto-electronic device. A representative device in this field is a quantum well Hall effect sensor as shown in FIG. 10. Any quantum well configurations mentioned previously can be used in forming the quantum well Hall effect sensor.

In this example, the structure 10 includes a first electrode 50, a second electrode 52, a third electrode 54, and a fourth electrode 56 in addition to the first, second, third, and fourth crystalline materials 12, 14, 16, and 18. In this example, the fourth crystalline material 18 operates as a capping layer.

The presently disclosed and claimed invention forms a quantum well Hall effect sensor having an enhanced sensitivity for magnetic field.

Planar Lightwave Circuit

In addition, the structure 10 can used to form a planar lightwave circuit. In this example, the second crystalline material 14 is chosen to form a bottom cladding, and the third crystalline material 16 is chosen to form a waveguide. Once the structure 10 is formed, portions of the third layer of crystalline material 16 can be removed (such as by a photolithography process followed by wet etching or dry etching techniques) such that the remaining portions of the third layer of crystalline material 16 form one or more waveguide(s), and the second layer of crystalline material 14 forms at least a bottom cladding for the waveguide(s).

The presently disclosed and claimed invention forms a waveguide having a higher transmission efficiency.

Although the above described specific applications are provided, it should be understood that the presently disclosed and claimed invention is applicable to many applications. For example, the presently disclosed and claimed invention can be used to form: a transistor (field-effect transistor, thin-film transistor, heterojunction bipolar transistor); a semiconductor memory; a diode; a light-emitting diode; a solar cell; a battery; a wave guide; a charge-coupled device; a LASER; a sensor/detector (photo-, x-ray-, image-, magnetic-, thermal-, etc.); a superconducting quantum interference device; an optical component (mirror, etc.); an acoustic wave resonator/filter; a magnetic read head; a varactor; a semiconductor switch; a thyristor; a thin-film passive electronic device (resistor, capacitor, transformer, inductor, etc.); a rectifier; a photo-conductor; a photo-diode; a photo-transistor; a electro-absorption modulator; a thermistor; a Hall sensor; a magneto-resistor; a magneto-diode; a magneto-transistor; a transducer; an actuator; a strain gauge; a cantilever sensor/probe; a peltier device and the like.

From the above description it is clear that the presently disclosed and claimed invention is well adapted to carry out the objective and to attain the advantages mentioned herein as well as those inherent in the invention. While more specific embodiments and applications of the invention have been described for purposes of this disclosure, it will be understood that numerous changes may be made which will readily suggest themselves to those skilled in the art and which are accomplished within the spirit of the invention disclosed and defined in the appended claims.

What is claimed is:

1. A low-defect-density crystalline structure, comprising:
   a first crystalline material;
   a layer of a second crystalline material epitaxially grown on the first crystalline material; and
   a layer of a third crystalline material epitaxially grown on the layer of the second crystalline material such that the layer of the second crystalline material is positioned between the first crystalline material and the layer of the third crystalline material;
   wherein the first crystalline material and the third crystalline material have a crystalline compatibility greater than a crystalline compatibility of the second crystalline material and the third crystalline material,
   wherein the layer of the second crystalline material has a thickness sufficient to form a desirable relationship with the third crystalline material, yet the thickness is such that the layer of the second crystalline material is strained, and
   wherein the layer of the third crystalline material is grown to a thickness beyond a critical thickness had the layer of the third crystalline material been grown on an unstrained layer of the second crystalline material.

2. The low-defect-density crystalline structure of claim 1, wherein the thickness of the layer of second crystalline material is determined as to minimize crystalline defects at an epitaxial interface between the first crystalline material and second crystalline material.

3. The low-defect-density crystalline structure of claim 1, wherein the first crystalline material can be formed of a substrate or an epitaxially grown layer.

4. The low-defect-density crystalline structure of claim 1, wherein the layer of the third crystalline material, subsequent to being grown on the layer of the second crystalline material, is further modified to form at least one of a conductive path, an optical waveguide, an electronic, or optical component.

5. The low-defect-density crystalline structure of claim 1, wherein the first crystalline material is formed as a layer having a top surface, the layer of the second crystalline material is formed on the top surface of the first crystalline material, and the layer of the third crystalline material is formed on a top surface of the layer of the second crystalline material.

6. The low-defect-density crystalline structure of claim 1, wherein the first crystalline material has at least two surfaces, and wherein the layer of the second crystalline material is formed on the at least two surfaces of the first crystalline material and the layer of the third crystalline material is formed on at least two surfaces of the layer of the second crystalline material.

7. The low-defect-density crystalline structure of claim 1, wherein the first crystalline material is formed as a polygonal structure possessing at least three surfaces, the layer of the second crystalline material is formed on the at least three surfaces of the first crystalline material, and wherein the layer of the third crystalline material is formed on the at least three surfaces of the layer of the second crystalline material.

8. A method of making a low-defect-density crystalline structure comprising the steps of:
   epitaxially growing a strained layer of a second crystalline material on a first crystalline material; and
   epitaxially growing a layer of a third crystalline material on the second crystalline material wherein the second crystalline material and third crystalline material cooperate to form a desirable relationship, the layer of the third crystalline material being grown to a thickness beyond the critical thickness had the layer of the third crystalline material been grown on an unstrained second crystalline material.

9. The method of claim 8, wherein the first crystalline material can be formed of a substrate or an epitaxially grown layer.

10. The method of claim 8 further comprising the step of, determining a thickness of the layer of the second crystalline material as to minimize crystalline defects at an epitaxial interface between the first crystalline material and the second crystalline material.

11. The method of claim 8, comprising the additional step of selecting crystalline materials wherein the first crystalline material and the third crystalline material have a crystalline compatibility greater than the crystalline compatibility of the second crystalline material and the third crystalline material.

* * * * *

UNITED STATES PATENT AND TRADEMARK OFFICE
CERTIFICATE OF CORRECTION

PATENT NO. : 7,923,098 B2
APPLICATION NO. : 11/968544
DATED : April 12, 2011
INVENTOR(S) : Tetsuya Mishima, Madhavie Edirisooriya and Michael B. Santos It is certified that error appears in the above-identified patent and that said Letters Patent is hereby corrected as shown below:

Column 9, line 48: After "GaP," delete "AIP," and replace with -- AlP, --

Column 9, line 49: After "GaN," delete "AIN," and replace with -- AlN, --

Column 10, line 64: After "vector," delete "f" and replace with -- $f$ --

Column 18, line 29: After "layer of" insert -- the --

Signed and Sealed this
Twenty-ninth Day of November, 2011

David J. Kappos
*Director of the United States Patent and Trademark Office*